United States Patent [19]

McClanahan et al.

[11] Patent Number: 5,354,599
[45] Date of Patent: Oct. 11, 1994

[54] DIELECTRIC VIAS WITHIN MULTI-LAYER 3-DIMENSIONAL STRUCTURES/SUBSTRATES

[75] Inventors: Robert F. McClanahan, Valencia; Robert D. Washburn, Malibu, both of Calif.

[73] Assignee: Hughes Aircraft Company, Los Angeles, Calif.

[21] Appl. No.: 127,460

[22] Filed: Sep. 27, 1993

Related U.S. Application Data

[63] Continuation of Ser. No. 951,473, Sep. 24, 1992, abandoned.

[51] Int. Cl.$^5$ .............................................. B32B 09/00
[52] U.S. Cl. .................................... 428/209; 428/210; 428/901; 428/137; 361/748; 361/750
[58] Field of Search ................ 428/901, 209, 210, 457, 428/137, 166; 361/748, 750

[56] References Cited

U.S. PATENT DOCUMENTS

| | | | |
|---|---|---|---|
| 4,749,621 | 6/1988 | Araps et al. | 428/209 |
| 4,816,323 | 3/1989 | Inoue | 428/209 |
| 4,857,381 | 8/1989 | Suzuki | 428/901 |
| 5,117,069 | 5/1992 | Higgins et al. | 428/901 |
| 5,139,852 | 8/1992 | Boise et al. | 428/901 |

FOREIGN PATENT DOCUMENTS

| | | | |
|---|---|---|---|
| 0015529 | 1/1991 | Japan | 428/901 |

OTHER PUBLICATIONS

Printed Circuits Handbook, Coombs, ed. 1989, p. G.9.

*Primary Examiner*—Patrick J. Ryan
*Assistant Examiner*—Patrick R. Jewik
*Attorney, Agent, or Firm*—L. A. Alkov; W. K. Denson-Low

[57] ABSTRACT

An array of dielectric vias formed in the insulating layers of a unitized multilayer circuit structure wherein the dielectric vias have a dielectric constant different from the dielectric constant of the insulating layers in which they are formed.

14 Claims, 6 Drawing Sheets

DIELECTRIC VIAS WITHIN MULTI-LAYER 3-DIMENSIONAL STRUCTURES/SUBSTRATES

This is a continuation of application Ser. No. 07/951,473, filed Sep. 24, 1992, abandoned.

BACKGROUND OF THE INVENTION

The disclosed invention is directed generally to hybrid multilayer circuit structures, and is directed more particularly to hybrid multilayer circuit structures having field control dielectric via structures formed therein.

Hybrid multilayer circuit structures implement the interconnection and packaging of discrete circuit devices, and generally include a unitized multilayer circuit structure formed from a plurality of integrally fused insulating layers (e.g., ceramic layers) having conductor traces disposed there-between. The discrete circuit devices (e.g., integrated circuits) are commonly mounted on the top insulating layer so as not to be covered by another insulating layer or on an insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

A consideration with hybrid multilayer circuit structures is shielding and controlling electric fields which are generated internally to the hybrid multilayer circuit structure (for example by RF stripline conductors), as well as for externally generated electric fields.

Known techniques for controlling electric fields in hybrid multilayer circuit structures include circuit conductor separation, and conductive shielding internal or external to the multilayer circuit structure. Conductive shielding adds significant cost in typical applications. Moreover, the required isolation is not always readily achieved with conductive shielding wherein ground/shield current flow can induce additional coupling. This undesirable effect becomes more difficult to control with RF power circuits.

A major consideration with conductive shielding is that both the field and induced conductor currents must be considered in controlling internal and external interference and feedback. Any non-orthogonal interaction between a field and a conductor will result in an induced current in the conductor. The induced current will vary at the same frequency as the field and at RF frequencies the resulting signal is not easily localized, and can be easily coupled into circuitry that is sufficiently near the conductor. Where the conductor is a ground, power, or shield plane, the induced signal can be coupled through parasitic elements into virtually any part of the circuitry. This is typically controlled by a combination of providing short, low impedance return paths, separate localized shielding, "point grounds", and modified circuit layouts. The major difficulty is that RF ground currents are not easily predicted or measured, which means that the particular means for controlling induced currents must be determined empirically. Thus, achieving the desired degree of circuit isolation might not be uncomplicated, quick or inexpensive.

SUMMARY OF THE INVENTION

It would therefore be an advantage to provide integral dielectric electric field shielding structures for multilayer circuit structures.

The foregoing and other advantages are provided by the invention in a dielectric via structure formed in the insulating layers of a multilayer circuit structure for isolating circuits in the multilayer circuit structure, from each other as well as from circuitry external to the multilayer circuit structure. A dielectric via structure in accordance with the invention comprises an arrangement of dielectric vias having dielectric constants that are different from the dielectric constant of the insulating layers in which they are formed. For example, a dielectric via structure can include an array or collection of dielectric vias having a dielectric constant higher than the dielectric constant of the insulating layers, as well as an array or collection of dielectric vias having a dielectric constant lower than the dielectric constant of the insulating layers.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1A:
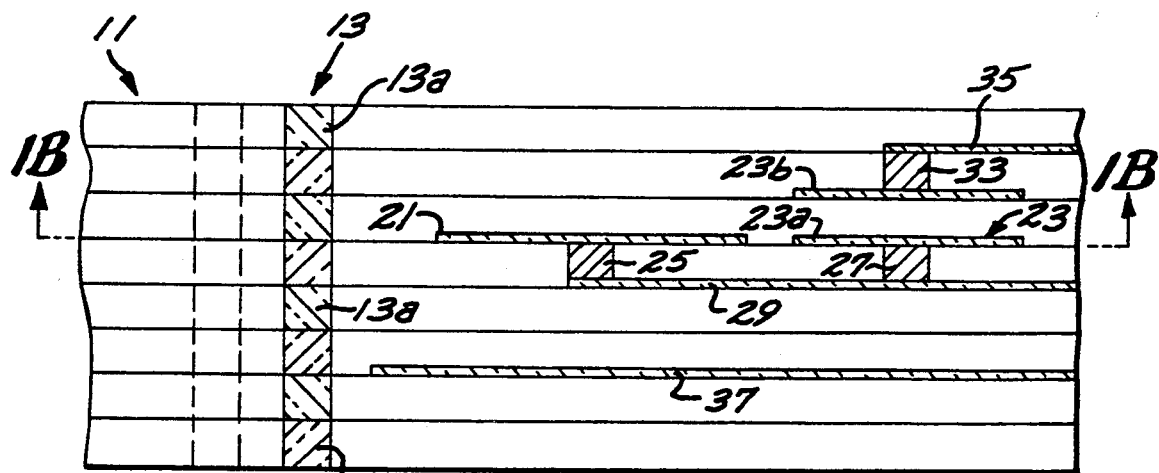
FIGS. 1A and 1B are views of a dielectric via structure 11 in accordance with the invention which includes a plurality of rows of dielectric via columns each comprising a stack of dielectric vias.

In the following detailed description and in the several figures of the drawing, like elements are identified with like reference numerals.

Dielectric via structures in accordance with the invention are implemented in a unitized multilayer circuit structure that is utilized for interconnecting various discrete circuits mounted on the outside thereof. The unitized multilayer circuit structure is formed from a plurality of insulating layers (comprising ceramic, for example), conductive traces disposed between the insulating layers, and conductive vias formed in the layers which together with any buried elements (e.g., elements formed on the top of an insulating layer and covered by an overlying insulating layer) are processed to form an integrally fused unitized multilayer structure. The discrete circuits are typically mounted and electrically connected on the outside of the unitized multilayer circuit structure after the unitizing fabrication.

In accordance with the invention, 3-dimensional dielectric via structures comprising dielectric vias (e.g., circular, line, and meander line vias) are formed in a unitized multilayer structure in different arrangements to achieve a variety of purposes, wherein the dielectric constant of the dielectric vias is higher or lower than the dielectric constant of the insulating layers of the substrate. As used herein, "high dielectric constant vias" or "high dielectric vias" refer to dielectric vias having a dielectric constant that is higher than the dielectric constant of the insulating layers in which the dielectric vias are formed; and "low dielectric constant vias" or "low dielectric vias" refer to dielectric vias having a dielectric constant that is lower than the dielectric constant of the insulating layers in which the dielectric vias are formed.

Appropriate via openings for the dielectric structures are formed in individual layers, for example by conventional techniques such as mechanical or laser drilling, together with via openings for other types of materials such as conductive via fills. The via openings for the dielectric via structures can be of different sizes and shapes to achieve a variety of special purposes, and can include narrow elongated via openings for line via structures. Large via openings may require radiused corners to maintain structural integrity of the ultimate unitized multilayer circuit structure. The via openings for the dielectric structures can be filled with dielectric material by conventional via fill techniques such as screen printing, for example. Larger via openings of a dielectric via structure can be filled with dielectric material plugs or inserts, as appropriate.

The incorporation of dielectric via structures allows for isolation or control of electric field interaction between electronic circuitry which is integral within a multilayer circuit structure (including components and component interconnections) and other circuitry within the multilayer circuit structure as well as the environment (including other electronic circuitry) external to the multilayer circuit structure. The dielectric vias can be used in patterns along or near an edge of the multilayer circuit structure, and in other regions of the multilayer structure to isolate circuitry, and the appropriate pattern of dielectric vias will depend on factors such as circuit layout, voltage and current levels, frequency, and bandwidth.

The inclusion of material of a dielectric constant different from that of the insulating layers allows for control of the location and intensity of the electric field at different locations in the substrate. By appropriate location of dielectric via structures within the substrate, unwanted signal coupling can be impeded, and desired coupling can be enhanced.

The choice of dielectric via pattern and material is highly dependent on the characteristics of the particular application including, for example, circuit geometry, operating frequencies, power level, and so forth. Although any number of different dielectric via fill materials can be used in a particular application, cost considerations may typically restrict the number to a maximum of two.

The dielectric via structures are very useful in circuitry utilizing VHF frequencies and above. However, there can be benefits for low frequency applications wherein the dielectric via pattern would typically be selected to create a capacitive divider effect between conductors that would replace the stray capacitance that would otherwise exist between them in the absence of the dielectric via pattern. The dielectric via material in such applications will typically have a dielectric constant lower than the dielectric constant of insulating layers in which they are formed so as to reduce the total value of the capacitance between the conductors. Since the isolating vias typically cannot provide continuous and total enclosure of a circuit, the basic substrate material will represent a parallel shunting capacitor to the divider structure created by the vias. This can contribute to retaining a high stray capacitance value, and it is usually important to construct the dielectric via pattern to increase the path length between the conductors through the insulating layers of the circuit structure in order to significantly reduce the value of the shunting capacitance. This can be accomplished in accordance with the invention with low dielectric line vias having a dielectric constant that is lower than the dielectric constant of the insulating layers in which they are formed.

For a typical low frequency circuit, the geometry of the components integral to the substrate is relatively large, and the number of circuit nodes and devices which have sufficient susceptibility to require dielectric isolation vias is low. This implies that the size and location of the dielectric vias in accordance with the invention can be determined using superposition of individual capacitive dividers between all conductors of interest. The capacitance values are calculated based on the substrate, circuit and via topology and materials. The techniques utilized for high frequency circuits, described below, can also be employed.

For high frequency (including microwave and millimeter wave) applications, the determination of the via locations and patterns is more complex since transmission line and distributed effects must be taken into account. In these cases, the isolation (or coupling) effects result primarily from the impedance differentials presented to the circuits by the different dielectric materials. Dielectric via fill materials with a dielectric constant higher than the dielectric constant of the insulating layers in which they are formed will be used most frequently, although the presence of high dielectric vias increases the total DC capacitance between conductors. The dielectric via structures and other isolating structures (including conductive ground planes) are best determined by constructing a three dimensional model of the particular substrate and calculating the fields present. The isolating structures can then be added, and their properties, sizes and positions altered through an iterative optimization process to achieve the desired field and circuit isolation for the specific application. Software that can accomplish this function and run on most CAD workstations (such as the SUN Spark II) include the "High Frequency Structure Simulator" by Hewlett Packard and "Maxwell" by ANSOFT.

For ease of identifying the dielectric via structures in accordance with the invention depicted in the figures of the drawing, the substrate insulating layers in which the dielectric vias are formed are not shaded while the dielectric vias forming the dielectric via structures are shaded.

Figure 1B:
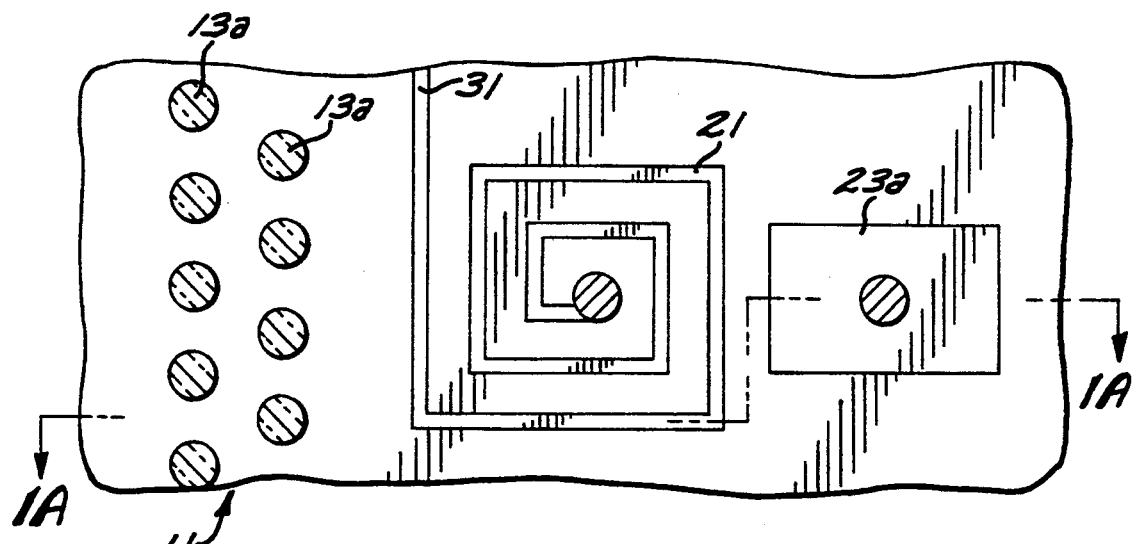

Referring now to FIGS. 1A and 1B, schematically depicted therein is a dielectric via structure 11 in accordance with the invention formed in the insulating layers of a multilayer circuit structure and comprising a plurality of rows of dielectric via columns 13 each comprising a stack of high dielectric constant vias 13a. The rows of dielectric via columns 13 essentially form a dielectric isolation region whose vertical and longitudinal extent (which is normal to plane of FIG. 1A) will depend on the required isolation. The rows of dielectric via columns 13 can be arranged linearly with or without bends or along a contour that is non-linear as viewed in plan view. Depending upon the application, the dielectric via columns can extend from the top insulating layer through the bottom insulating layer, or they can be confined to certain ones of the inside layers.

By way of example, the dielectric via structure 11 is shown as providing shielding as to a series LC circuit formed in the multilayer circuit structure. The series LC circuit includes a screen printed spiral inductor 21, and a parallel plate capacitor comprising a screen printed bottom plate 23a and a screen printed top plate 23b. Interconnection between the inductor 21 and the capacitor 23 is made by conductive vias 25, 27 and a conductive trace 29, while connections to the LC circuit are made by a screen printed conductive trace 31 connected to the inductor and a conductive via 33 that is connected to the top capacitor plate 23b and a conductive trace 35.

The circuit structure of FIGS. 1A and 1B further includes an embedded ground plane 37. The dielectric via columns can be made to contact the ground plane, and for example can extend to or through the bottom insulating layer of the structure.

Figure 2A:
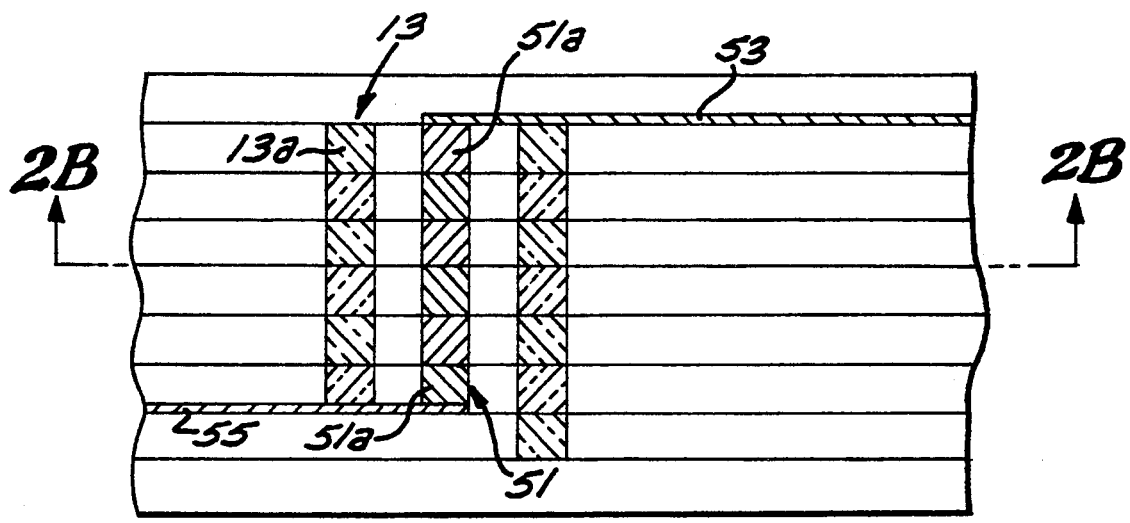
FIGS. 2A and 2B are views of a dielectric via structure 11 in accordance with the invention which includes a plurality of via columns arranged in a pattern around a vertical conductor for shielding the conductor.
Figure 2B:
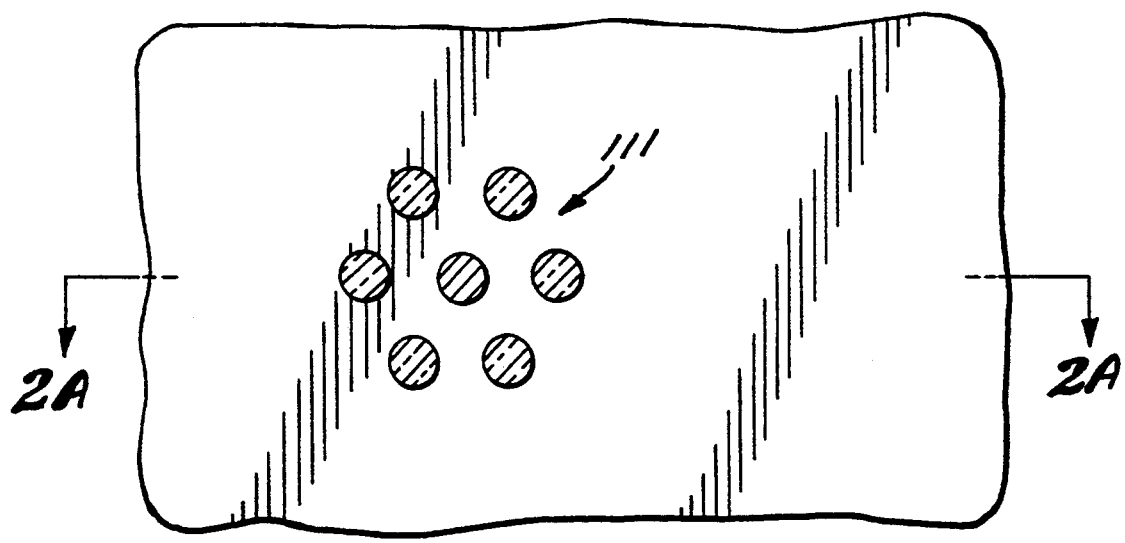

Referring now to FIGS. 2A and 2B, schematically depicted therein is a dielectric via structure 111 in accordance with the invention formed in the insulating layers of a multilayer circuit structure for shielding a conductive via column 51 comprising a stack of conductive vias 51a which interconnect conductive traces 53, 55 which are on different layers. The dielectric via structure 111 includes a plurality of dielectric via columns 13, each including a stack of dielectric vias 13a, that surround the conductive via column 51.

Figure 3A:
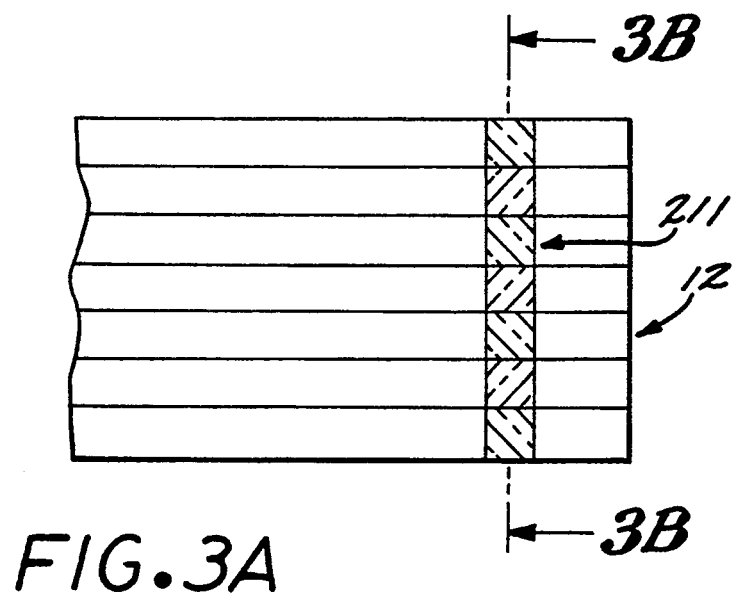
FIGS. 3A and 3B are views a dielectric via structure in accordance with the invention which includes a plurality of line vias arranged in a planar grid.
Figure 3B:
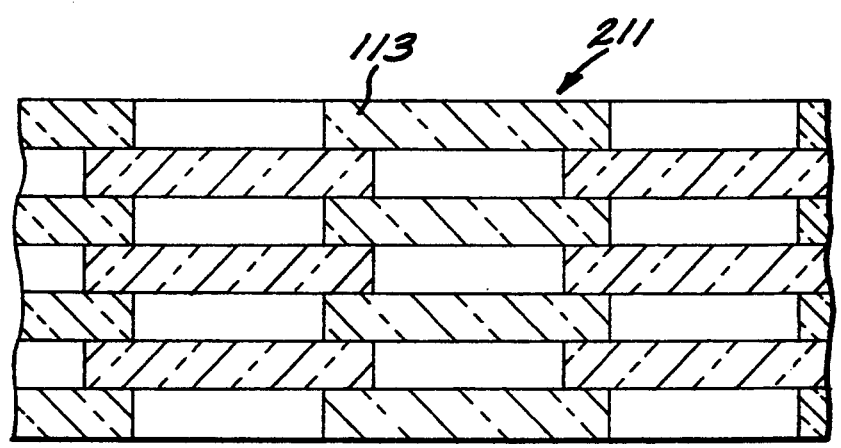

Referring now to FIGS. 3A and 3B, schematically depicted therein is a dielectric via structure 211 in accordance with the invention formed in the insulating layers of a multilayer circuit structure and comprising a plurality of line vias 113 arranged in a planar grid, for example along an edge 12 of the multilayer circuit structure. Each row of the planar grid comprises linearly aligned line vias 113 of fixed length that are spaced by less than their lengths, and the respective rows are staggered relative to each other such that the ends of the line vias 113 in each row are in contact with the end portions of the line vias 113 of an adjacent row. It should be appreciated that the line vias 113 are shown as having squared ends for convenience of illustration. In actual implementation, the ends of the line vias 113 as well as other line vias described herein would have radiused ends.

Figure 4A:
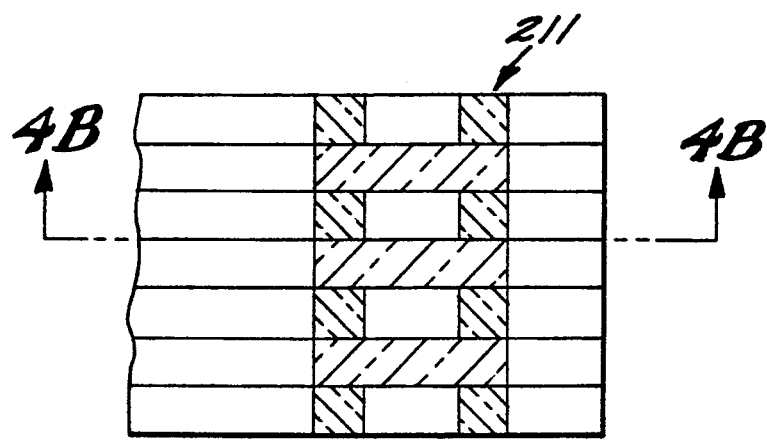
FIGS. 4A, 4B, 4C are views of a dielectric via structure in accordance with the invention which includes a plurality of line vias arranged in a non-planar grid.
Figure 4B:
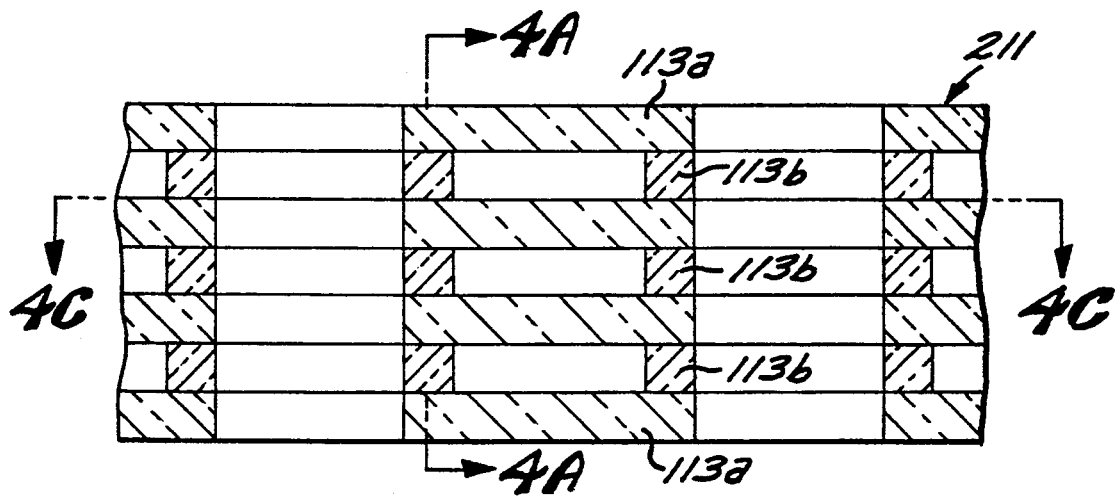
Figure 4C:
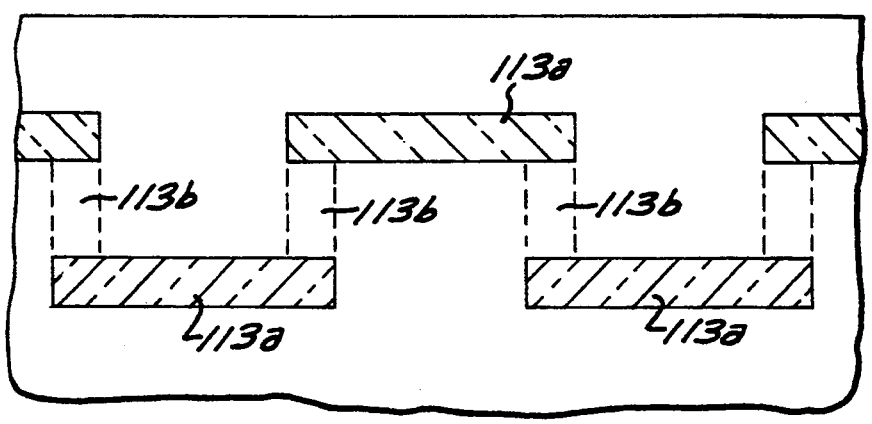

Referring now to FIGS. 4A, 4B, 4C, schematically depicted therein is a dielectric via structure 211 in accordance with the invention formed in the insulating layers of a multilayer circuit structure and comprising a plurality of line vias 113a, 113b arranged in a non-planar grid, for example along an edge 12 of the multilayer circuit structure. The grid is formed of alternating layers of a first pattern of line vias 113a having a first length and a second pattern of line vias 113b having a second length. The line vias 113a in the first pattern are arranged in two staggered parallel rows with the spacing between the line vias 113a in each row being less than the length of each of the line vias 113a and selected so that the overlap of the ends of the line vias is substantially the same as the width of the line vias 113b of the second pattern which are oriented cross wise to the line vias 113a so as to bridge the overlapping ends of line vias 113a that are in different rows. The distance between the rows of the line vias 113a of the first pattern is selected such that the cross wise oriented, parallel line vias 113b of the second pattern will contact the ends of the overlapping ends of line vias 113a that are in different rows.

Figure 5:
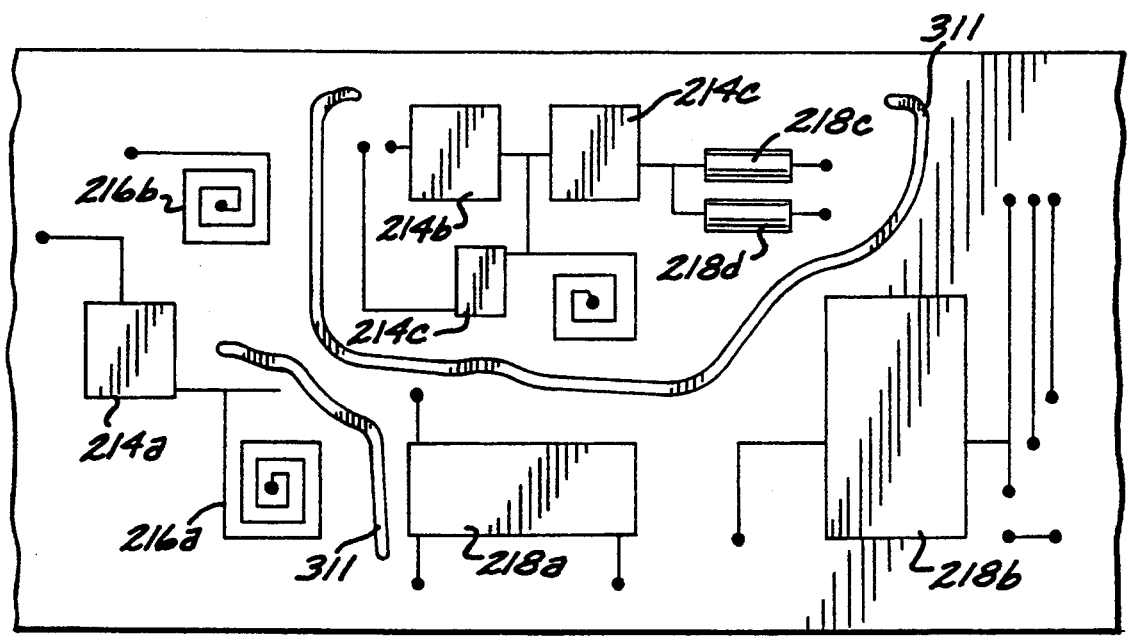
FIG. 5 is a view of dielectric meander line via structures in accordance with the invention.

Referring now to FIG. 5, set forth therein is a schematic top plan view of meander line via structures 311 in accordance with the invention formed in the insulating layers of a multilayer circuit structure for isolating passive components that are in different circuits. As shown for illustration only and not for any specific circuit configuration, the passive components can include screen printed capacitors 214a, 214b, and 214c; inductors 216a, 216b; and resistors 218a, 218b, 218c, 218d, 218e. Each of the meander line via structures 311 includes one or more meander line vias in multiple layers. By way of illustrative examples, the multiple layer meander line vias can comprise a vertical stack of meander lines having the same contour, or the multiple layer meander lines vias can comprise a grid of meander lines in the different layers in a manner similar to the line via configurations shown in FIGS. 3A and 3B. As a further example, the multiple layer meander line vias can comprise a grid of interlocked meander lines.

Figure 6A:
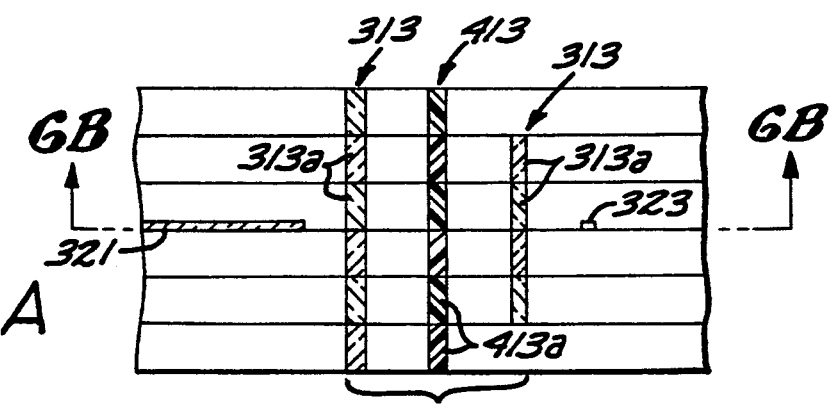
FIGS. 6A and 6B are views of a dielectric via structure in accordance with the invention which includes first and second stacks of high dielectric constant line vias that are on either side of a stack of low dielectric constant line vias.
Figure 6B:
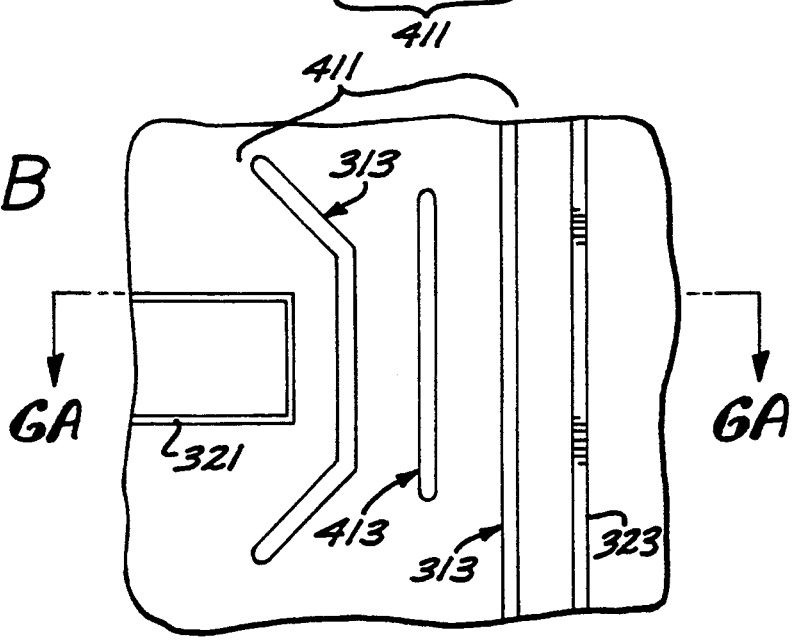

Referring now to FIGS. 6A and 6B, schematically depicted therein is a dielectric via structure 411 in accordance with the invention formed in the insulating layers of a multilayer circuit structure and comprising a first and second stacks 313 of high dielectric constant line vias 313a that are on either side of a stack 413 of low dielectric constant line vias 413a. The stacks of dielectric line vias together provide for isolation between two conductors 321 and 323. The dielectric structure of FIGS. 6A and 6B illustrate the use of line vias in some or all the layers of the multilayer circuit structure in which they are implemented.

The foregoing dielectric via structures can be used along or near the edges of a multilayer circuit structure to control EMI leakage through the edges of the circuit structure, or in the interior of the circuit structure to isolate circuits in one portion thereof from circuits in another portion. A dielectric via structure in accordance with the invention can be arranged with bends and/or curves to partially or fully enclose circuits in the multilayer structure.

Figure 7A:
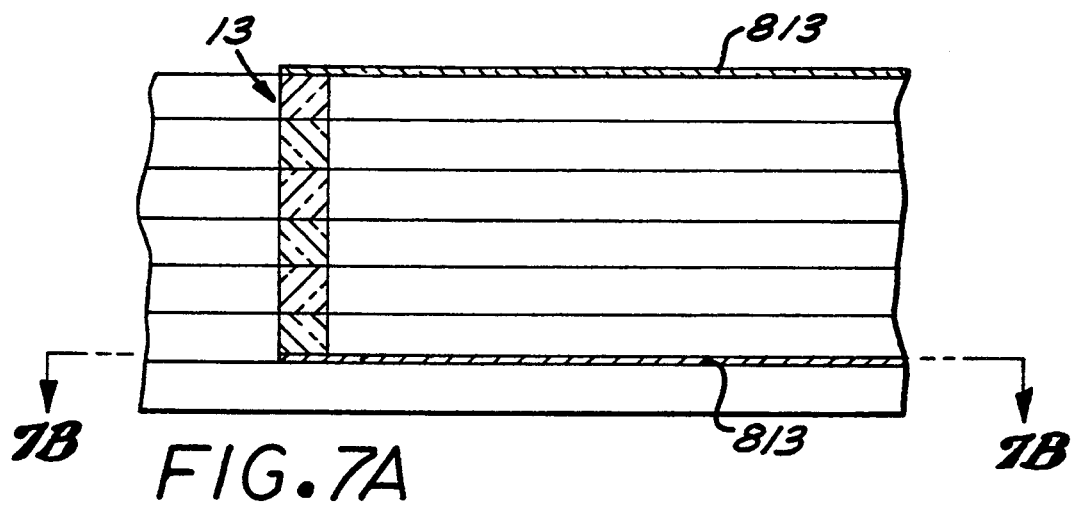
FIGS. 7A and 7B are views of horizontally oriented dielectric printed areas that cooperate with dielectric via columns for providing isolation in two directions.
Figure 7B:
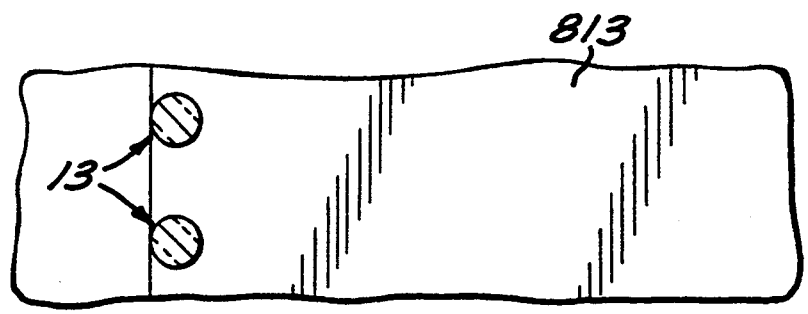

A horizontal isolation structure can be provided in conjunction with the foregoing vertical isolation structures by patterns of dielectric vias in one or more layers above and/or below the region to be isolated. By way of illustrative example, a horizontal pattern of dielectric vias can include a layer of line vias arranged in a grid pattern that would appear in plan view similarly to the elevational pattern of line vias in FIG. 3B. A further example would be a layer of circular vias in a uniformly spaced pattern. Referring particularly to FIGS. 7A and 7B, horizontal isolation structures can also be provided by horizontally extending printed areas 813 of dielectric material above and/or below a vertically extending dielectric via structure that is intended to provide for horizontal isolation, such as the dielectric via columns 13 shown.

Figure 8:
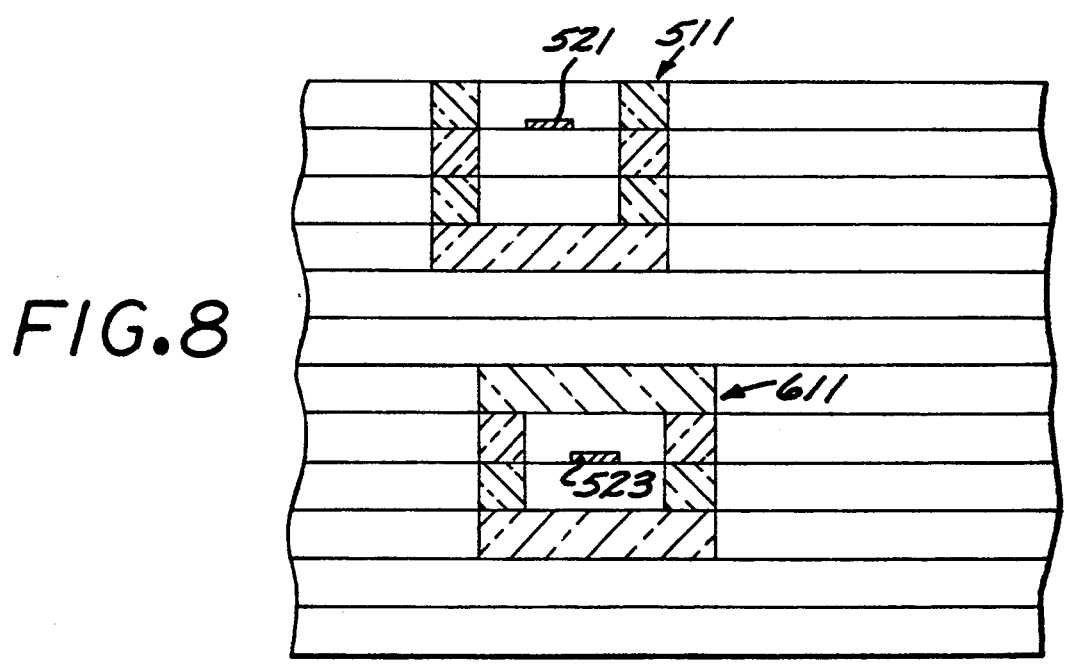
FIG. 8 sets forth dielectric via structures in accordance with the invention for isolating conductors which are on different layers of a multilayer circuit structure.

Further as to vertical and horizontal isolation, FIG. 8 sets forth dielectric via structures 511 and 611 for isolating conductors 521, 523 which are on different layers. The dielectric structure 511 includes three sides that are U-shaped in cross section and follow the contour of the conductor 521, while the dielectric structure 611 includes four sides that are rectangular in cross section and follow the contour of the conductor 523. Each side of the dielectric structures 511, 611 comprises, a pattern of line vias or via columns, such as the interlocked line vias and rows of columns previously described.

Dielectric via structures in accordance with the invention are made, for example, pursuant to low temperature co-fired processing such as disclosed in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In accordance with low temperature co-fired processing, vias are formed in a plurality of green thick film tape layers at locations defined by the desired via configurations of the desired multilayer circuit. The vias are filled with the appropriate fill material, for example, by screen printing. Conductor metallization for conductive traces including the stripline conductors and the embedded ground planes are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate. External metallization including the lower ground plane metallization and any side wall metallization can then be applied by known techniques.

Dielectric via structures in accordance with the invention can also be implemented with other technologies for forming unitized multilayer circuit structures, including for example high temperature co-fired ceramics, hard ceramic multilayer single firing technology, and a laminated soft substrate approach.

The foregoing has been a disclosure of dielectric via structures that are advantageously incorporated in unitized multilayer circuit structures and are fabricated utilizing processes for forming unitized multilayer circuit structures. Structures in accordance with the invention provide for isolating or controlling the electric field interaction between circuitry that is integral to the multilayer circuit structure and other circuitry that is also integral to the multilayer circuit structure, as well as the environment external to the multilayer circuit structure. Effectively, dielectric via structures in accordance with the invention form regions having a dielectric constant that is different from the dielectric constant of the insulating layers in which the dielectric via structures are formed. Low dielectric constant via material is for creating high capacitive reactance, while high dielectric constant via material is for creating low capacitive reactance.

Although the foregoing has been a description and illustration of specific embodiments of the invention, various modifications and changes thereto can be made by persons skilled in the art without departing from the scope and spirit of the invention as defined by the following claims.

What is claimed is:

1. A multilayer circuit structure comprising:
   a plurality of planar dielectric insulating layers having a first dielectric constant, said dielectric insulating layers being integrally fused into a unitized substrate; and
   an array of dielectric vias formed in said insulating layers for controlling the locations and intensities of electric fields within said unitized substrate, said dielectric vias having a dielectric constant different from said first dielectric constant, said vias comprised completely of a dielectric material.

2. The multilayer circuit structure of claim 1 wherein said array of dielectric vias includes dielectric vias having a dielectric constant that is higher than said first dielectric constant.

3. The multilayer circuit structure of claim 1 wherein said array includes dielectric vias arranged in a plurality of columns as viewed perpendicularly to the planar extent of said insulating layers.

4. The multilayer circuit structure of claim 1 wherein said array of dielectric vias includes dielectric vias having a dielectric constant that is lower than said first dielectric constant.

5. A multilayer circuit structure comprising:
   a plurality of planar dielectric insulating layers having a first dielectric constant, said dielectric insulating layers being integrally fused into a unitized substrate; and
   an array of dielectric line vias formed in said insulating layers for controlling the locations and intensities of electric fields within said unitized substrate, said dielectric line vias having a dielectric constant different from said first dielectric constant, said line vias comprised completely of a dielectric material.

6. The multilayer circuit structure of claim 5 wherein said array of dielectric line vias includes dielectric line vias having a dielectric constant that is greater than said first dielectric constant.

7. The multilayer circuit structure of claim 5 wherein said array of dielectric line vias includes line vias having a dielectric constant that is less than said first dielectric constant.

8. The multilayer circuit structure of claim 5 wherein said array includes dielectric line vias arranged in a stack as viewed perpendicularly to the planar extent of said insulating layers.

9. The multilayer circuit structure of claim wherein said array includes dielectric line vias interconnected in a grid as viewed perpendicularly to the planar extent of said insulating layers.

10. A multilayer circuit structure comprising:
    a plurality of planar dielectric insulating layers having a first dielectric constant, said dielectric insulating layers being integrally fused into a unitized substrate; and
    an array of dielectric meander line vias formed in said insulating layers for controlling the locations and intensities of electric fields within said unitized substrate, said dielectric meander line vias having a dielectric constant different from said first dielectric constant, said meander line vias comprised completely of a dielectric material.

11. The multilayer circuit structure of claim 10 wherein said array of dielectric meander line vias includes dielectric meander line vias having a dielectric constant that is greater than said first dielectric constant.

12. The multilayer circuit structure of claim 10 wherein said array of meander line dielectric line vias includes dielectric meander line vias having a dielectric constant that is less than said first dielectric constant.

13. The multilayer circuit structure of claim 10 wherein said array includes dielectric meander line vias arranged in a stack as viewed perpendicularly to the planar extent of said insulating layers.

14. The multilayer circuit structure of claim 10 wherein said array includes dielectric meander line vias interconnected in a grid as viewed perpendicularly to the planar extent of said insulating layers.

* * * * *